United States Patent
Basker et al.

(10) Patent No.: US 9,620,619 B2
(45) Date of Patent: Apr. 11, 2017

(54) BORDERLESS CONTACT STRUCTURE

(75) Inventors: Veeraraghavan S. Basker, Schenectady, NY (US); David V. Horak, Essex Junction, VT (US); Charles W. Koburger, III, Delmar, NY (US); Shom Ponoth, Clifton Park, NY (US); Chih-Chao Yang, Glenmont, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 674 days.

(21) Appl. No.: 13/348,894

(22) Filed: Jan. 12, 2012

(65) Prior Publication Data

US 2013/0181261 A1    Jul. 18, 2013

(51) Int. Cl.
| H01L 21/20 | (2006.01) |
| H01L 29/78 | (2006.01) |
| H01L 29/66 | (2006.01) |
| H01L 21/768 | (2006.01) |
| H01L 21/28 | (2006.01) |

(52) U.S. Cl.
CPC .. H01L 29/66545 (2013.01); H01L 21/76897 (2013.01); H01L 29/66628 (2013.01); H01L 29/78 (2013.01)

(58) Field of Classification Search
CPC ... H01L 21/20; H01L 21/28; H01L 21/76897; H01L 29/78; H01L 29/66545; H01L 29/66628
USPC .............. 438/586, 595, 675, 666, 597, 142, 438/197–308; 257/288
See application file for complete search history.

(56) References Cited

U.S. PATENT DOCUMENTS

| 5,759,867 | A |  | 6/1998 | Armacost et al. |
| 6,200,866 | B1 | * | 3/2001 | Ma et al. ...................... 438/299 |
| 6,440,807 | B1 | * | 8/2002 | Ajmera et al. ................ 438/300 |
| 6,544,850 | B1 |  | 4/2003 | Schnabel et al. |
| 6,548,357 | B2 |  | 4/2003 | Weybright et al. |
| 6,884,715 | B1 |  | 4/2005 | Kwon et al. |
| 7,005,744 | B2 |  | 2/2006 | Chen et al. |
| 7,172,933 | B2 | * | 2/2007 | Huang et al. ................. 438/197 |
| 7,659,171 | B2 | * | 2/2010 | Furukawa et al. ............ 438/299 |
| 2001/0001506 | A1 | * | 5/2001 | Dennison ....................... 257/774 |
| 2006/0040484 | A1 | * | 2/2006 | Dokumaci et al. ........... 438/595 |
| 2008/0124814 | A1 | * | 5/2008 | Kumar et al. .................... 438/4 |

(Continued)

*Primary Examiner* — Natalia Gondarenko
(74) *Attorney, Agent, or Firm* — Yuanmin Cai; Andrew M. Calderon; Roberts Mlotkowski Safran Cole & Calderon, P.C.

(57) ABSTRACT

A borderless contact structure or partially borderless contact structure and methods of manufacture are disclosed. The method includes forming a gate structure and a space within the gate structure, defined by spacers. The method further includes blanket depositing a sealing material in the space, over the gate structure and on a semiconductor material. The method further includes removing the sealing material from over the gate structure and on the semiconductor material, leaving the sealing material within the space. The method further includes forming an interlevel dielectric material over the gate structure. The method further includes patterning the interlevel dielectric material to form an opening exposing the semiconductor material and a portion of the gate structure. The method further includes forming a contact in the opening formed in the interlevel dielectric material.

19 Claims, 7 Drawing Sheets

(56) References Cited

U.S. PATENT DOCUMENTS

2009/0230427 A1*  9/2009  Dyer et al. .................... 257/190
2009/0283830 A1* 11/2009  Callegari et al. ............. 257/351
2011/0108930 A1   5/2011  Cheng et al.
2012/0126331 A1*  5/2012  Lin et al. ...................... 257/369

* cited by examiner

US 9,620,619 B2

BORDERLESS CONTACT STRUCTURE

FIELD OF THE INVENTION

The invention relates to semiconductor structures and, more particularly, to a borderless contact structure or partially borderless contact structure, and methods of manufacture.

BACKGROUND

Semiconductors and integrated circuit chips have become ubiquitous within many products due to their continually decreasing cost and size. In the microelectronics industry, there is a continued desire to reduce the size of structural features of the microelectronic devices and/or to provide a greater amount of circuitry for a given chip size. Miniaturization in general allows for increased performance (e.g., more processing per clock cycle and less heat generated) at lower power levels and lower cost. However, further size reductions appear to be approaching the physical limit of trace lines and micro-devices that are embedded upon and within their semiconductor substrates.

Basically, a FET is a transistor having a source, a gate, and a drain. The action of the FET depends on the flow of carriers along a channel between the source and drain that runs past the gate. Current through the channel, which is between the source and drain, is controlled by the transverse electric field under the gate. The length of the gate determines how fast the FET switches, and can be about the same as the length of the channel (i.e., the distance between the source and drain).

As the critical dimensions of CMOS devices are being aggressively scaled, forming contacts on those small devices is becoming more and more difficult due to the tight overlay tolerance. Accordingly, there exists a need in the art to overcome the deficiencies and limitations described hereinabove.

SUMMARY

In an aspect of the invention, a method comprises forming a gate structure and a space within the gate structure, defined by spacers. The method further comprises blanket depositing a sealing material in the space, over the gate structure and on a semiconductor material. The method further comprises removing the sealing material from over the gate structure and on the semiconductor material, leaving the sealing material within the space. The method further comprises forming an interlevel dielectric material over the gate structure. The method further comprises patterning the interlevel dielectric material to form an opening exposing the semiconductor material and a portion of the gate structure. The method further comprises forming a contact in the opening formed in the interlevel dielectric material.

In another aspect of the invention, a method comprises forming a gate structure and removing materials of the gate structure to form a space between spacers of the gate structure. The method further comprises blanket forming a sealing material within the space and over portions of the gate structure and a raised underlying semiconductor layer. The method further comprises removing the sealing material from over the gate structure and the raised underlying semiconductor layer. This removal leaves the sealing material only within the space. The method further comprises forming a dielectric material over the sealing material and on exposed portions of the raised underlying semiconductor material. The method further comprises patterning the dielectric material so that an edge of an opening overlaps with a portion of the gate structure. The method further comprises forming a contact within the opening. The contact is separated from gate material of the gate structure.

In an additional aspect of the invention, a structure comprises a gate structure and a raised source and drain region. The structure further comprises at least a partial borderless contact provided in an opening of a dielectric material. The at least partial borderless contact is in contact with at least the source region and the drain region and overlapping with a portion of the gate structure. The structure further comprises a blocking material formed over a low resistance material of the gate structure, and between spacers thereof.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a borderless or partially borderless contact structure, which comprises the structures of the present invention. In still further embodiments, a method in a computer-aided design system is provided for generating a functional design model of the borderless or partially borderless contact structure.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor structures and, more particularly, to a borderless contact structure or partially borderless contact structure, and methods of manufacture. More specifically, in embodiments, the borderless contact structure of the present invention partially overlaps a gate structure, with an intervening material that prevents contact and/or interference between the contact and the underlying gate material. In further embodiments, the partially borderless contact structure of the present invention partially overlaps a spacer material formed on the gate structure. In these embodiments, the spacer material will prevent contact and/or interference between the contact and the underlying gate material. The borderless contact structure or partially borderless contact structure are formed using lithographic and etching process, including the formation of a sealing material to prevent contact between a gate material and a contact, in at least the borderless contact structure. Advantageously, the borderless contact structure and partially borderless contact structure reduce overall space requirements on the substrate, thus allowing further scaling of devices. Also, the borderless contact structure and partially borderless contact structure contact the underlying source region and/or drain region, without compromising electrical isolation between the source region, the drain region and the adjacent gate structures.

Figure 1:
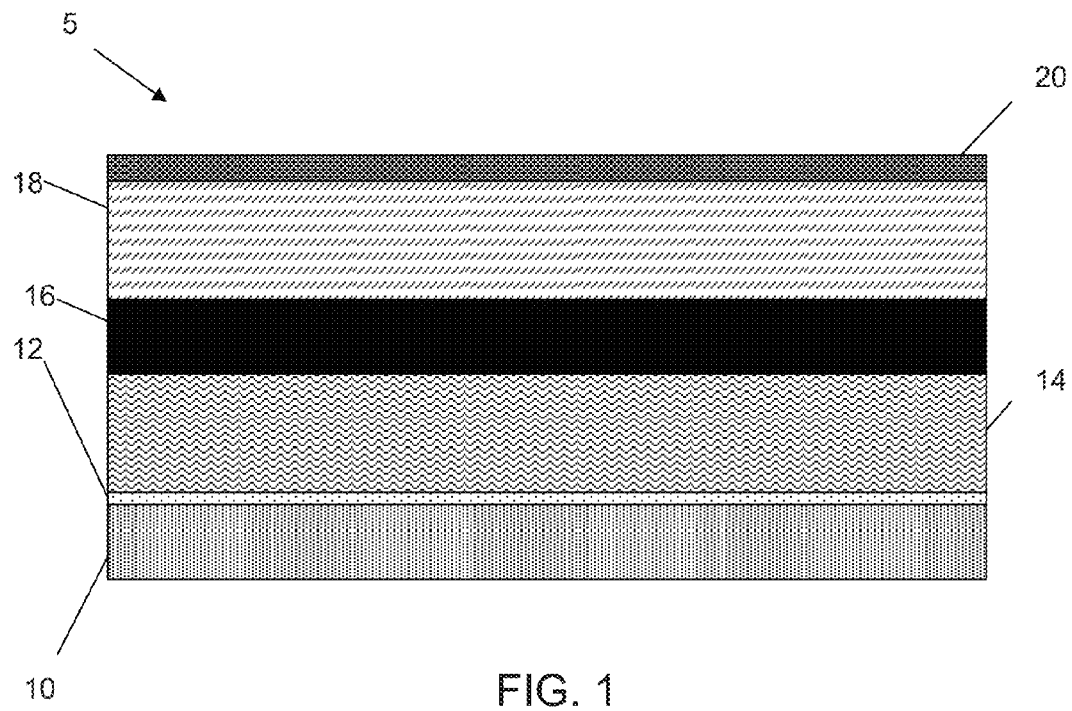
FIGS. 1-10 show structures and respective processing steps in accordance with aspects of the present invention.

FIG. 1 shows a structure and respective processing steps in accordance with aspects of the present invention. More specifically, the structure 5 of FIG. 1 includes a layer of semiconductor material 10. The semiconductor material 10 can be, for example, Silicon, SiGe or other semiconductor material known to those of skill in the art. A dielectric material 12 is formed on the semiconductor material 10. The dielectric material 12 can be any gate dielectric material such as a high-k dielectric material or low-k dielectric or combinations thereof. In embodiments, the high-k dielectric material can be, for example, hafnium based material, e.g., hafnium oxide. The dielectric material 12 can also be a low-k dielectric such as, for example, $SiO_2$. The dielectric material 12 can also be a stack of dielectric materials, either low-k, high-k or combinations thereof. In embodiments, the dielectric material 12 is formed by a conventional deposition process, e.g., chemical vapor deposition (CVD), atomic layer deposition (ALD) or oxidation processes, to a depth of about 10 Å to 25 Å; although other dimensions are also contemplated by the present invention. In embodiments, the dielectric material 12 can have an electrical thickness of about 8 Å to 12 Å; although other dimensions are also contemplated by the present invention.

Still referring to FIG. 1, a poly material or other work function material(s) 14 can be formed on the dielectric material 12. In embodiments, the work function materials can be, for example, TiN, TaN or other known metals or metal alloys used to adjust the work function of a gate structure (e.g., FET). In embodiments, the material 14 is deposited on the dielectric material 12 using conventional CVD processes. The thickness of the material 14 can vary depending on the desired design parameters.

A low resistance material 16 is formed on the material 14. For example, low resistance material 16 is tungsten; although other materials are also contemplated by the present invention. In embodiments, the low resistance material 16 has a thickness of about 100 Å to about 300 Å; although other dimensions are contemplated by the present invention, any of which is driven by a desired resistance. A hardmask 18 is formed on the low resistance material 16. In embodiments, the hardmask 18 is a $SiO_2$. A second hardmask 20 is formed on the hardmask 18. In embodiments, the hardmask 18 and second hardmask 20 are formed of different materials. For example, the second hardmask 20 can be a nitride; whereas, the hardmask material 18 is an oxide based material.

Figure 2:
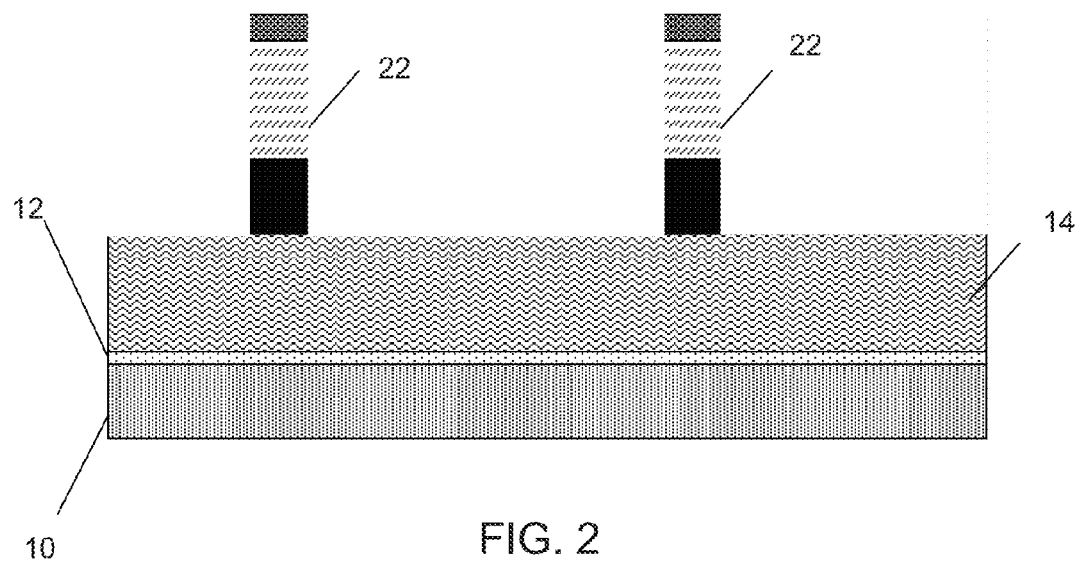

In FIG. 2, the layers 16, 18 and 20 are patterned to form a structure 22. In embodiments, the structure 22 will form part of a gate stack. In embodiments, the structures 22 are formed by applying a resist over the second hardmask 20, and exposing the resist to energy, hence forming a pattern (openings). An etching process, e.g., reactive ion etching (RIE), is then performed through the openings to remove any exposed material. After the material is removed, the resist can be stripped using an oxygen ashing process, for example. In embodiments, the structures 22 have a width of about 5 nm to about 15 nm; although other dimensions are also contemplated by the present invention.

Figure 3:
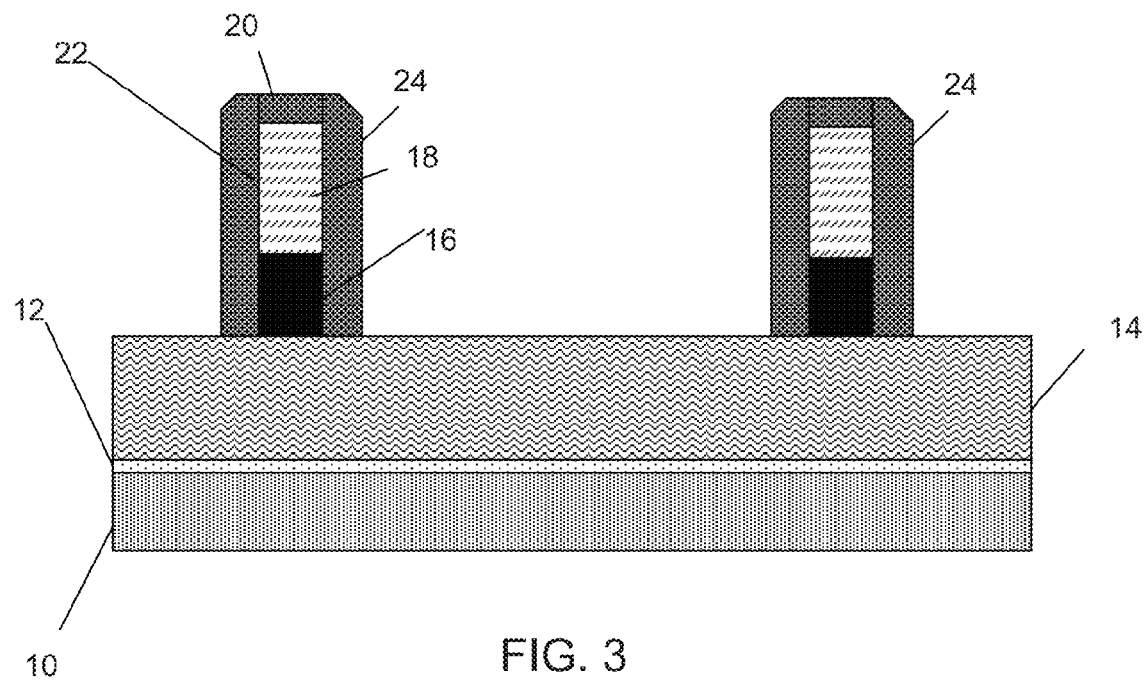

FIG. 3 shows additional processing steps and respective structure in accordance with aspects of the present invention. More specifically, FIG. 3 shows the formation of spacers 24 on the respective structures 22, e.g., on the material 16 and 18. In embodiments, the spacers 24 can be, for example, a nitride material, formed by a conformal deposition process. In embodiments, the spacers 24 should be the same material as the material 20. More specifically, nitride material is conformally deposited on the exposed surfaces, e.g., over the structures 22 and the material 14. The material is then directionally etched using a conventional etching process, e.g., RIE, to form the spacers 24.

Figure 4:
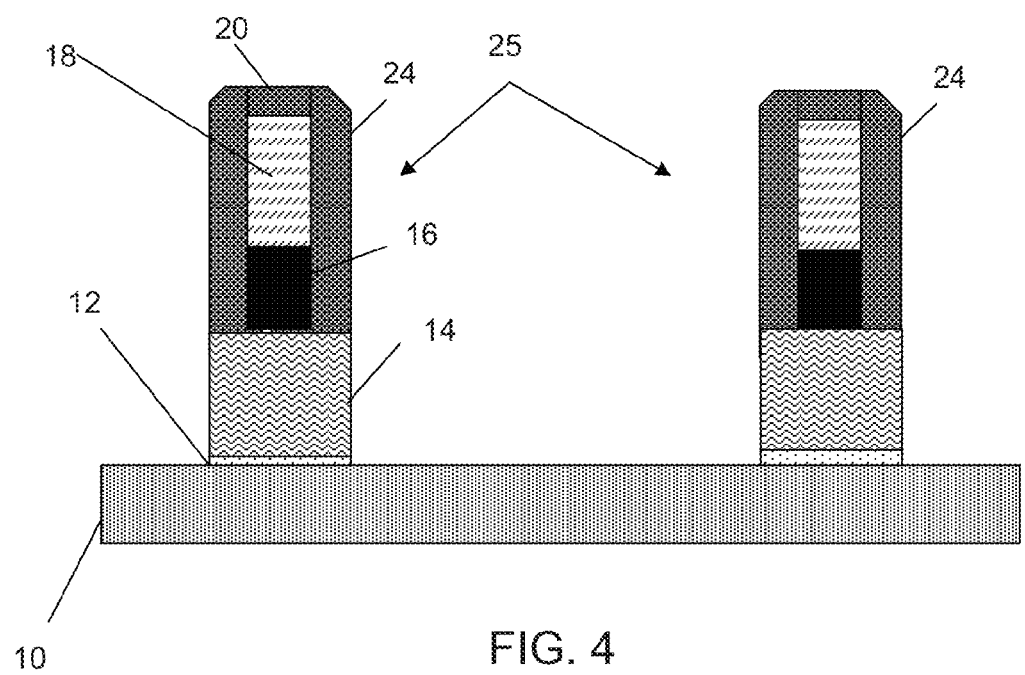

In FIG. 4, the shape of the spacer 24 is transferred to the material 14 and dielectric material 12 through a directional etching process, e.g., RIE. In this process, the material 14 and the dielectric material 12 are etched using a conventional directional etch process, e.g., RIE, with the spacer 24 acting as a mask. In embodiments, the etching stops on the semiconductor layer 10. In this process, the RIE chemistry is selective to nitride, e.g., material of the spacers 24 and material 20. In this way, the etching process will not remove the nitride material such that it will protect any non-exposed portions of the underlying layers 12, 14, 16 and 18. In embodiments, the resultant gate structure 25 will have a dimension of about 12 nm to about 25 nm; although other dimensions are also contemplated by the present invention.

Figure 5:
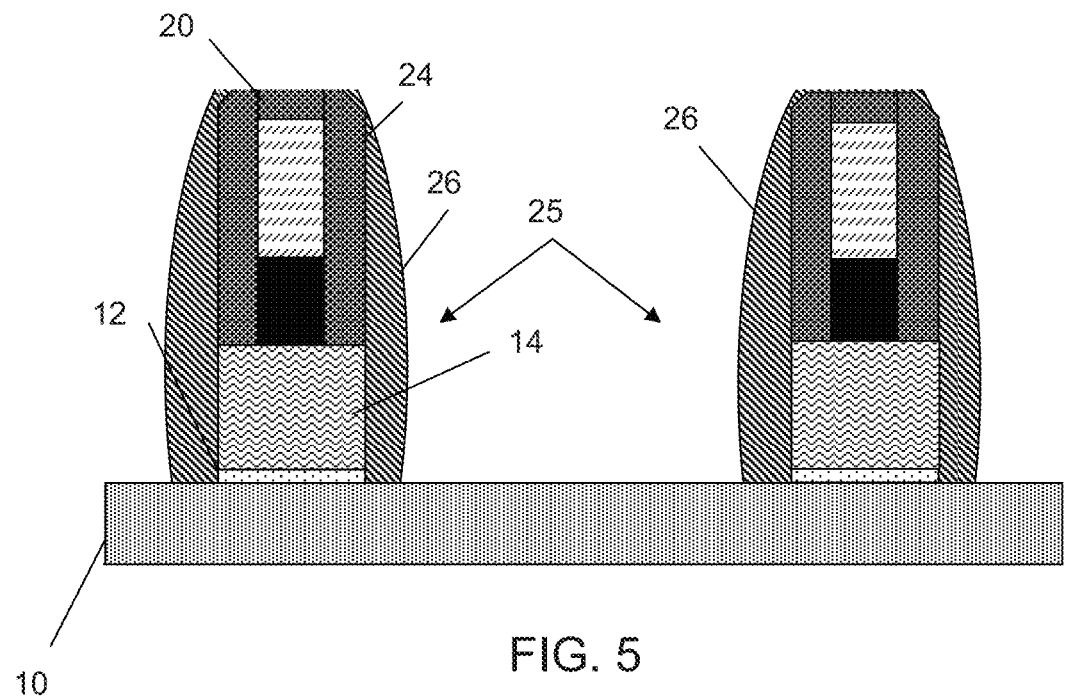

In FIG. 5, device spacers 26 are formed on the gate structures 25. In embodiments, the device spacers 26 can be, for example, a nitride material. The device spacers 26 can be formed by a conformal deposition process, which forms material on all exposed surfaces, e.g., over the device spacers 26 and the semiconductor material 10. The material is then directionally etched using a conventional etching process, e.g., RIE, to form the device spacers 26 on the gate structures 25. In embodiments, the device spacers 26 provide offsets for the source and drain diffusions and/or dopants.

Figure 6:
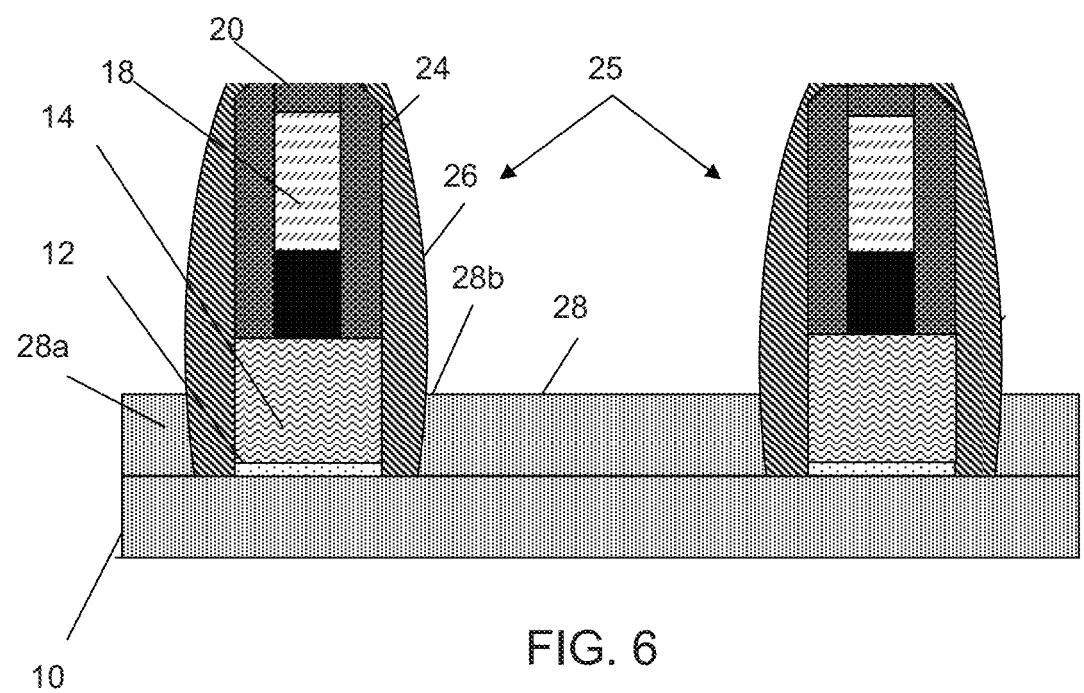

In FIG. 6, the semiconductor material 10 undergoes a conventional precleaning process to remove any residual material, e.g., nitride or other materials. The precleaning process can be, for example, an Hf chemistry. As should be understood by those of skill in the art, the material 20 will protect the underlying oxide material 18 during the precleaning process.

Still referring to FIG. 6, a semiconductor material 28 is grown on the exposed portions of the semiconductor material 10 in order to form raised source and drain regions 28a, 28b. In embodiments, the semiconductor material 28 can be, for example, an epitaxial stress material such as SiGe. In alternative embodiments, the semiconductor material 28 can be single crystalline poly material. In further embodiments, the semiconductor material 28 can be other semiconductor materials, as should be understood by those of skill in the art. The semiconductor material 28 can also be doped material to form the source and drain regions 28a, 28b, or can be implanted at a later processing step. In embodiments, the height of the semiconductor material 28 can vary depending on the desired capacitance of the structure. In embodiments, though, the semiconductor material 28 can be located at any position below the top surface of the structure 25.

Figure 7:
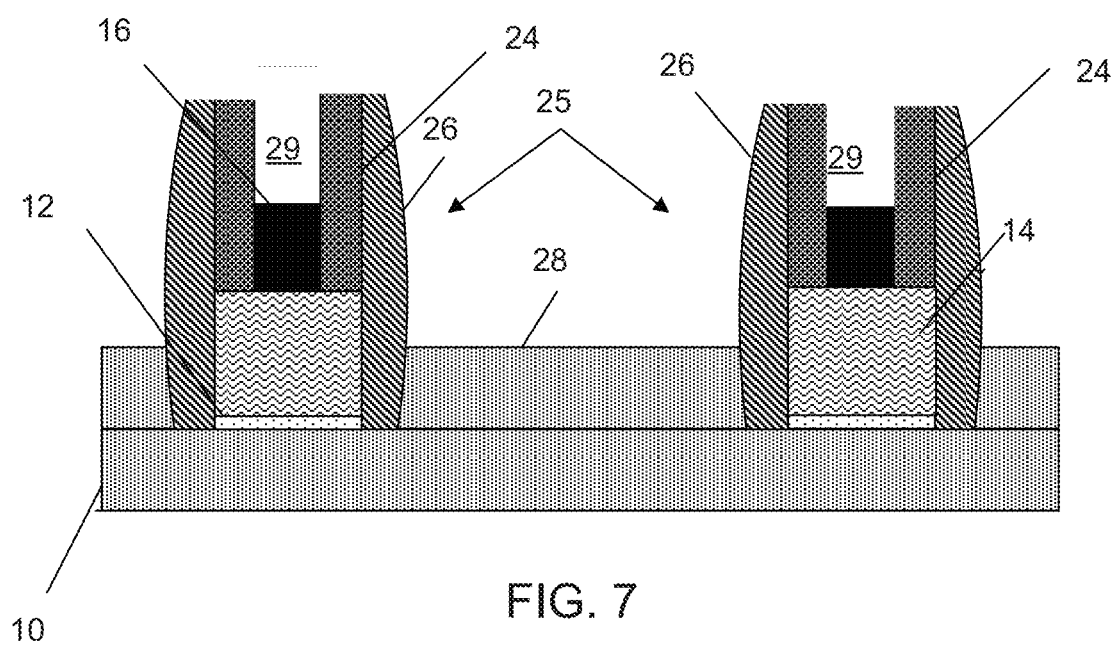

In FIG. 7, portions of the gate structure 25 are removed using a conventional directional etching process. More specifically, the material (20) and the material (18) are removed using respective etching processing. In embodiments, the etching process comprises a directional nitride etching process to remove a nitride material (20), followed by a directional oxide etching process to remove the oxide material (18). The etching processes will form a space 29 between the spacers 24. Also, using the directional etching process, the device spacers 26 will remain on the sidewalls of the gate structure 25.

Figure 8:
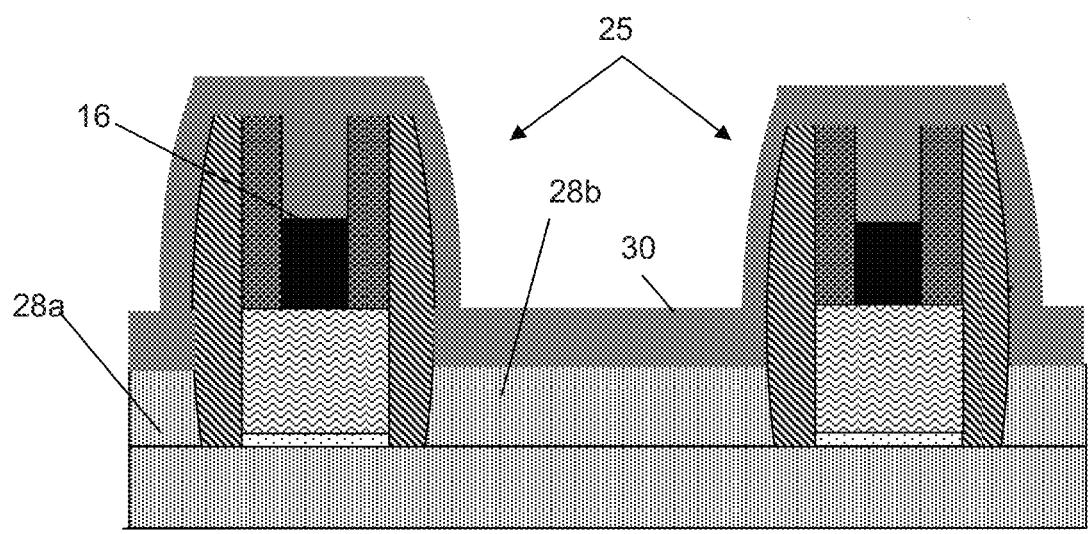

As shown in FIG. 8, a conformal deposition process forms a layer of sealing or blocking material 30 on the semiconductor material 28 and within the space 29, which seals the underlying material 16. More specifically, in embodiments, the sealing material 30 will seal the gate structure 25, and even more specifically, protect the low resistance material 16 from being contacted with a contact. In embodiments, the conformal deposition process is a nitride deposition process, e.g., same material as the device spacers 26, preferably comprising an ALD process; although, other conformal deposition processes are also contemplated by the present invention. Moreover, in embodiments, the source and drain regions 28a, 28b can be implanted after this deposition process, or during other process steps.

Figure 9:
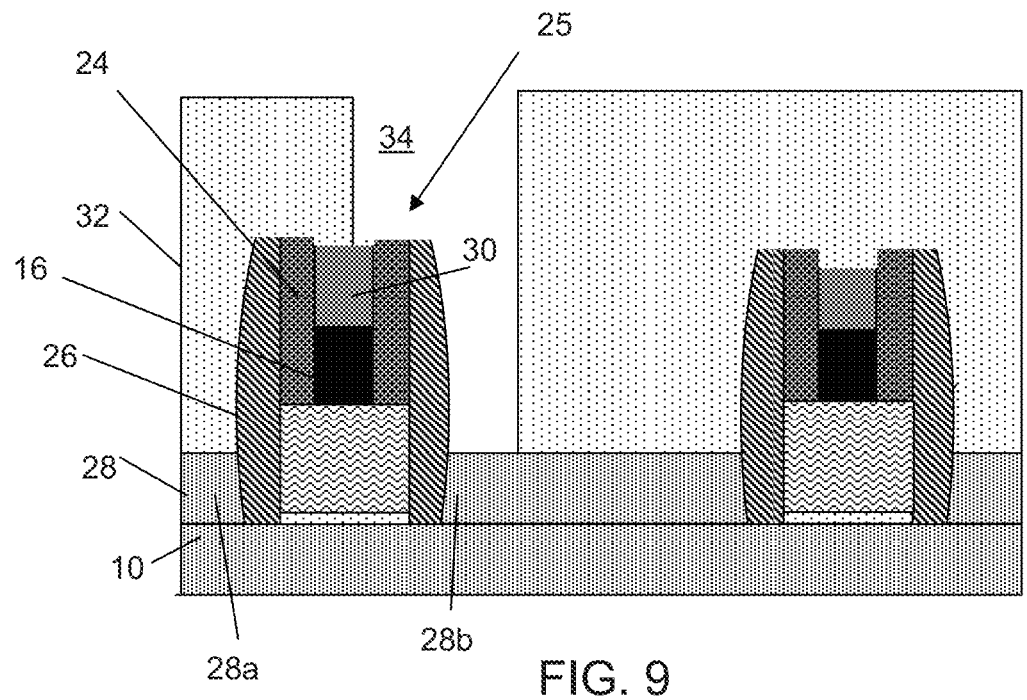

In FIG. 9, portions of the sealing material 30 are removed using conventional etching processes. More specifically, the sealing material 30 is removed over the device spacers 26 and the semiconductor material 28. However, as shown in FIG. 9, the sealing material 30 remains within the space of the gate structure 25, albeit slightly recessed, in order to seal the material 16. In embodiments, the sealing material 30 can be removed by an isotropic removal process such as a hot phosphorous process, as is known to those of skill in the art. As noted above, the source and drain regions 28a, 28b can be implanted after this deposition process, or during other process steps.

Still referring to FIG. 9, an interlevel dielectric material 32 is formed on the exposed surfaces of the gate structure 25 and the semiconductor material 28. An opening 34 is then formed in the interlevel dielectric material 32 using conventional lithographic and etching processes. As the interlevel dielectric material 32 is different than the sealing material 30, the etching process will not remove the sealing material 30 formed within the space of the gate structure 25. In this way, only exposed portions of the interlevel dielectric material 32 will be removed by the etching process. In embodiments, the edge of the opening 34 partially overlaps the gate structure 25, and more specifically a portion of the sealing material 30. In this way, the opening 34 exposes a portion of the sealing material 30, in addition to one of the device spacers 26 and the underlying semiconductor material 28, e.g., at a source and/or drain region.

Figure 10:
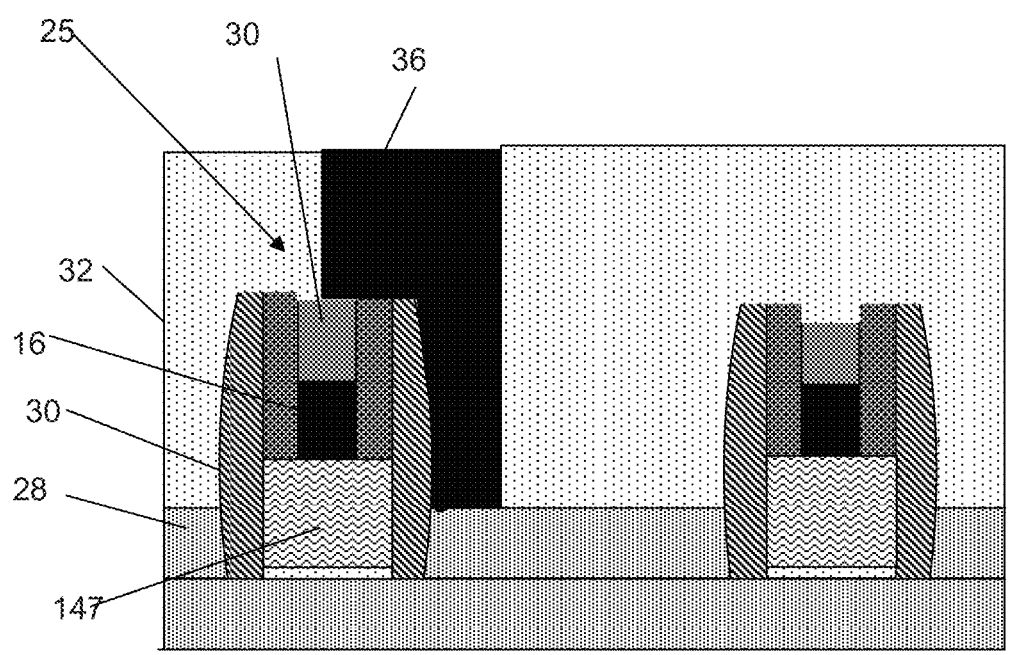

In FIG. 10, contact processes are then performed, as is known to those of skill in the art. For example, a contact 36 is formed in the opening to form a borderless structure, e.g., borderless to the nitride materials. More specifically, as should now be recognized by those of skill in the art, the contact 36 is allowed to overlap with the gate structure 25, e.g., contact the sealing material 30, and contact the source and/or drain regions 28a, 28b. In this way, the sealing material 30 provides an "avoidance" strategy so the contact 36 does not contact, e.g., connect or interfere with, the gate material, e.g., workfunction material 14 or low resistance material 16. In embodiments, the contact 36 can be for formed with a liner, e.g., TiN or TaN, and a body of tungsten or copper, for example, formed by conventional deposition processes.

Figure 11:
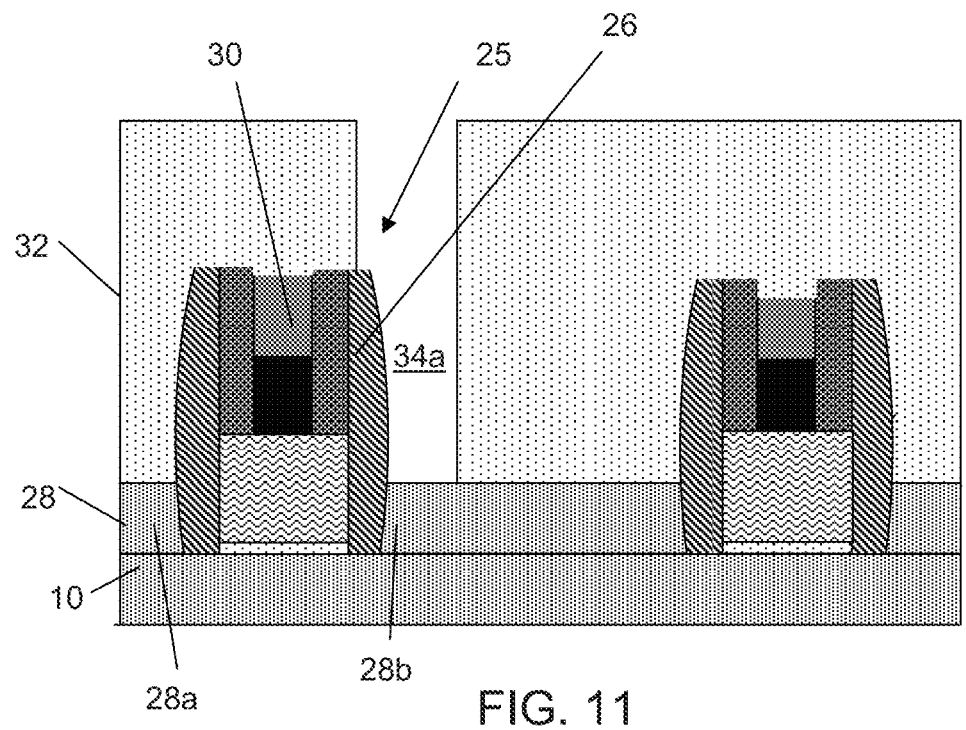
FIGS. 11 and 12 show alternative structures and respective processing steps in accordance with aspects of the present invention.
Figure 12:
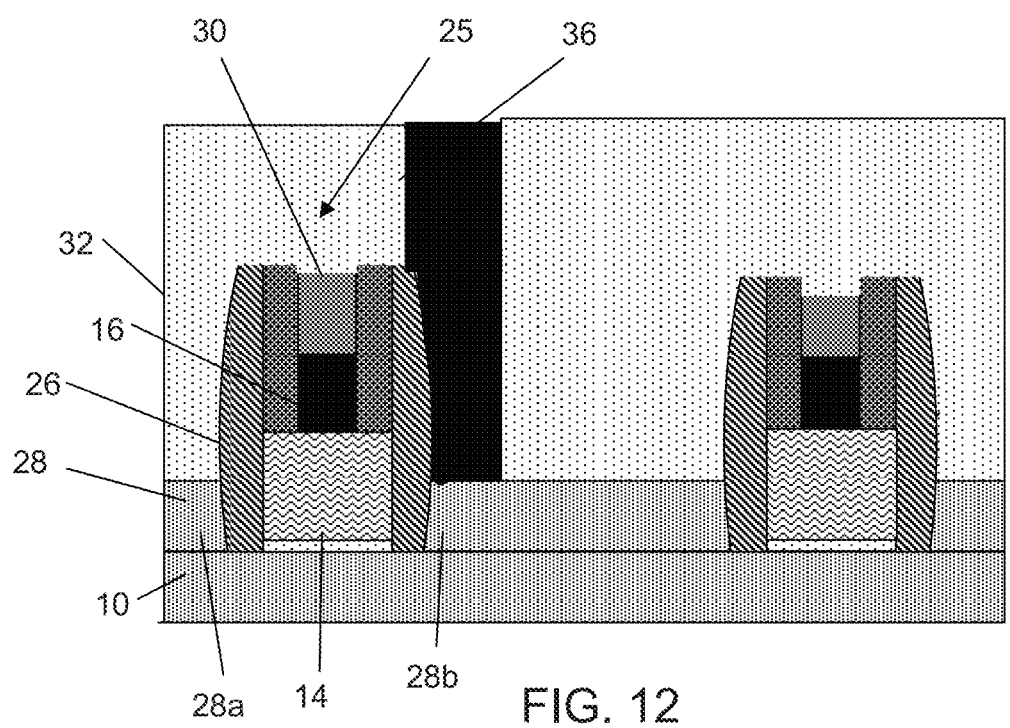

FIGS. 11 and 12 show alternative structures and respective processing steps in accordance with additional aspects of the present invention. For example, starting from the structure shown in FIG. 8, in FIG. 11, portions of the sealing material 30 are removed using conventional etching processes. More specifically, the sealing material 30 is removed over the device spacers 26 and the semiconductor material 28. However, as noted above, the sealing material 30 remains within the space of the gate structure 25, albeit slightly recessed, in order to seal the material 16. In embodiments, the sealing material 30 on the device spacers 26 and the raised semiconductor layer 28 can be removed by an isotropic process such as a hot phosphorous process, as is known to those of skill in the art.

As described above, an interlevel dielectric material 32 is formed on the exposed surfaces of the gate structure 25 and the semiconductor material 28. An opening 34a is then formed in the interlevel dielectric material 32 using conventional lithographic and etching processes. In embodiments, the edge of the opening 34a partially overlaps, i.e., lands partly on, the device spacer 26, thereby exposing only a portion of device spacer 26, in addition to a portion of the underlying semiconductor material 28, e.g., source or drain region (between the two gate structures 25). In embodiments, the removal, e.g., etching, of the dielectric material 32 to form the opening may also attack, e.g., remove, portions of the device spacer 26 and spacers 24; however, the material 14 and material 26 will still remain protected by the device spacer 26 and/or spacers 24.

In FIG. 12, contact processes are then be performed, as is known to those of skill in the art. For example, a contact 36 is formed in the opening to form a partially borderless structure. More specifically, as should now be recognized by those of skill in the art, the contact 36 is partially bordered by the device spacer 26; however, the contact 36 is electrically isolated, i.e., not allowed to contact, e.g., connect or interfere with, the gate material, e.g., material 14 or material 16. That is, the blocking can now be provided by the device spacers 26. In embodiments, the contact 36 can be tungsten or copper, for example, formed by conventional deposition processes, which is in contact with the source and/or drain regions (28a, 28b). It should be recognized by those of skill in the art that the figures are not to scale, and that any materials that are shown to be in contact are considered to be in direct contact with no intervening layers therebetween.

Figure 13:
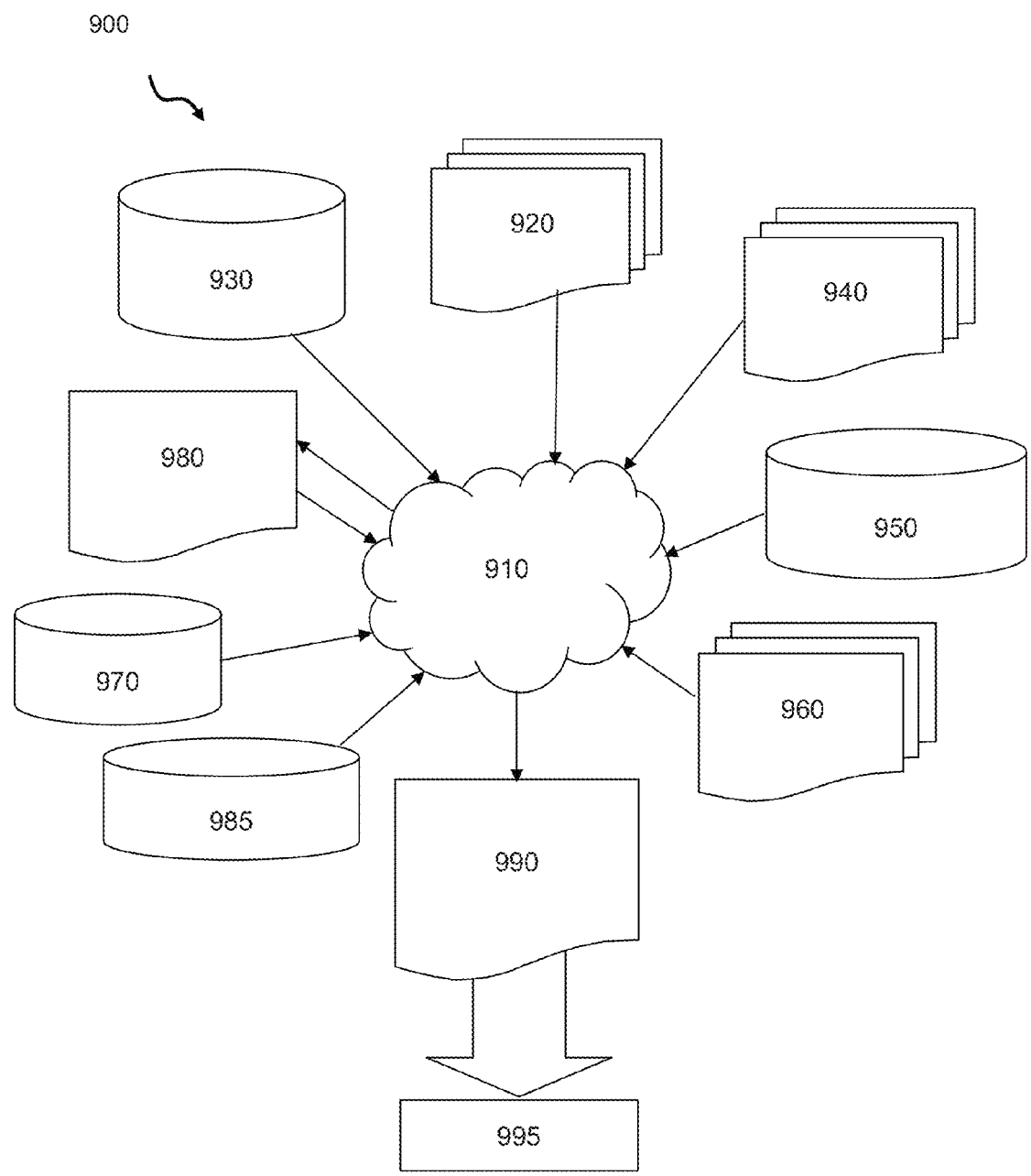
FIG. 13 is a flow diagram of a design process used in semiconductor design, manufacture, and/or test.

FIG. 13 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-12. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-12. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-12 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-12. In one embodiment, design structure 990 may comprise a compiled, executable HDL simulation model that functionally simulates the devices shown in FIGS. 1-12.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-12. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming a gate structure, comprising:
      forming a gate dielectric material on a substrate;
      forming a work function metal on the gate dielectric material;
      forming a metal material on the work function metal;
      forming a material on the metal material;
      forming a masking material on the material;
      patterning the metal material, material and the masking material;
      forming spacers on sidewalls of the patterned metal material, material and the masking material;
      after formation of the spacers, patterning the gate dielectric material and the work function metal with the spacers used as a masking to set a dimension of the patterned gate dielectric material and the work function metal;
   forming a space within the gate structure by removing the material and the masking material, defined by the spacers;
   forming device spacers on the side of the spacers and the patterned gate dielectric material and the work function metal, extending to the substrate;
   forming source and drain regions on the substrate and sides of the device spacers;
   blanket depositing a sealing material in the space, over the gate structure and on the source and drain regions comprising semiconductor material;
   removing the sealing material from over the gate structure and on the semiconductor material, while leaving the sealing material within the space;
   forming an interlevel dielectric material over the gate structure subsequent to the removing of the sealing material;
   patterning the interlevel dielectric material to form an opening exposing the semiconductor material and a portion of the gate structure; and
   forming a contact in the opening formed in the interlevel dielectric material, wherein:
   the masking material, the spacers, the device spacers and the sealing material are formed of a first material type,
   the material is a second material type, different than the first material type,
   the interlevel dielectric material is different than the first material type, and
   the patterning the interlevel dielectric material is a selective etch such that the spacers, the device spacers and the sealing material of the first material type remain intact during the patterning of the interlevel dielectric material.

2. The method of claim 1, wherein an edge of the opening is formed to overlap with the sealing material formed between the spacers.

3. The method of claim 2, wherein the contact is formed partially over the sealing material, and the sealing material blocks contact between the contact and an underlying gate material.

4. The method of claim 3, wherein the underlying gate material is the metal material formed on the workfunction material.

5. The method of claim 1, wherein an edge of the opening is formed on the device spacer of the gate structure, and the contact is formed partially on the device spacer.

6. The method of claim 1, wherein
   forming the source and drain regions comprises forming a raised epitaxial semiconductor layer, adjacent to the device spacers and on the substrate comprising an underlying semiconductor layer; and
   forming the sealing material in the space, over the device spacers and the raised epitaxial semiconductor layer, prior to the removing step.

7. The method of claim 6, wherein the sealing material is formed on the metal material, within the space formed by the spacers.

8. The method of claim 7, wherein the sealing material and the device spacers are nitride, the nitride is removed from over the device spacers and the raised epitaxial semiconductor layer by a directional etch, and the nitride sealing material is formed in direct contact with the metal material.

9. The method of claim 1, wherein the contact material is separated from the metal material of the gate structure by at least the sealing material.

10. The method of claim 6, wherein the epitaxial semiconductor layer is a stress layer.

11. The method of claim 6, wherein the sealing material is a nitride layer, and the space is formed by removing an underlying oxide material formed on the metal material, and the nitride sealing material is formed in direct contact with the metal material.

12. A method comprising:
   forming a gate structure;
   removing materials of the gate structure to form a space between spacers of the gate structure;
   blanket forming a sealing material within the space and over portions of the gate structure and a raised underlying semiconductor layer;
   removing the sealing material from over the gate structure and the raised underlying semiconductor layer, thereby leaving the sealing material only within the space;
   forming a dielectric material over the sealing material and on exposed portions of the raised underlying semiconductor material subsequent to the removing of the sealing material;
   patterning the dielectric material so that an edge of an opening overlaps with a portion of the gate structure; and
   forming a contact within the opening, the contact being separated from gate material of the gate structure, wherein:
   the forming of the gate structure comprising:
      forming a dielectric layer on an underlying substrate,
      forming a work function metal directly on the dielectric layer;
      forming a metal layer directly on the work function metal;
      forming a first mask directly on the metal layer;
      forming a second mask directly on the first mask;

patterning the metal layer, first mask and second mask;

forming nitride spacers on the sidewalls of the patterned metal layer, first mask and second mask, and on an upper surface of the work function material, patterning the dielectric layer and the work function metal, using the nitride spacers as a mask;

forming nitride device spacers directly on the nitride spacers and sidewalls of the patterned dielectric layer and the patterned work function material;

the removing of the materials of the gate structure comprises removing the first mask and the second mask to form the space;

the blanket forming of the sealing material comprises blanket depositing nitride material within the space; and the patterning the dielectric material is a selective etch such that the nitride spacers, the device nitride spacers and the nitride sealing material remain intact during the patterning of the dielectric material.

13. The method of claim 12, wherein:

the patterning of the dielectric material comprises forming the edge of the opening over a portion of the gate structure; and the contact is separated from the metal material by the sealing material or the device spacers.

14. The method of claim 12, wherein the blanket forming is a nitride blanket conformal deposition process.

15. The method of claim 12, wherein:

the edge of the opening is formed to overlap with the sealing material formed between the spacers; and the contact is formed partially over the sealing material, and the sealing material blocks contact between the contact and an underlying metal material formed on a workfunction material.

16. The method of claim 12, wherein the edge of the opening is formed on the nitride device spacers of the gate structure, and the contact is formed partially on the nitride device spacers.

17. A structure comprising:

a gate structure comprising:

a gate dielectric material on a substrate;

a work function metal directly on the gate dielectric material;

a metal material directly on the work function metal;

nitride spacers directly on sidewalls of the metal material;

a nitride blocking material directly on the metal material and in a space defined by the nitride spacers; and nitride device spacers directly on sidewalls of the gate dielectric material and the work function metal and directly on the nitride spacers on sidewalls of the metal material and nitride blocking material;

a raised source region and raised drain region comprising a semiconductor material directly on the substrate and extending to directly contact the nitride device spacers; and at least a partial borderless contact provided in an opening of a dielectric material, the at least partial borderless contact being in contact with at least the raised source region and the raised drain region and overlapping with a portion of the gate structure.

18. The structure of claim 17, wherein the partial borderless contact is a borderless contact formed in direct contact with a device spacer and on the blocking material.

19. The structure of claim 17, wherein the partial borderless contact is in direct contact with a device spacer of the gate structure.

* * * * *